United States Patent
Shih et al.

(10) Patent No.: US 9,425,294 B2
(45) Date of Patent: Aug. 23, 2016

(54) DISPLAY ARRAY SUBSTRATE AND MANUFACTURING METHOD THEREOF

(71) Applicant: Ye Xin Technology Consulting Co., Ltd., Hsinchu (TW)

(72) Inventors: Po-Li Shih, Hsinchu (TW); Yi-Chun Kao, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/556,731

(22) Filed: Dec. 1, 2014

(65) Prior Publication Data

US 2015/0279976 A1   Oct. 1, 2015

(30) Foreign Application Priority Data

Apr. 1, 2014  (TW) .............. 103112204 A

(51) Int. Cl.
*H01L 29/66* (2006.01)
*H01L 29/786* (2006.01)
*H01L 29/12* (2006.01)

(52) U.S. Cl.
CPC ..... *H01L 29/66969* (2013.01); *H01L 29/7869* (2013.01)

(58) Field of Classification Search
CPC ..... H01L 21/00; H01L 29/66; H01L 29/786; H01L 21/31; H01L 21/469; H01L 21/288; H01L 21/02; H01L 21/4763; H01L 21/44; H01L 29/7869; H01L 29/4908; H01L 29/517; H01L 29/45; H01L 29/417; H01L 29/12; H01L 29/41733; H01L 29/78606; H01L 27/3248; H01L 27/3258
USPC ........... 438/167, 85, 86, 104, 754, 149, 164, 438/22, 23, 24, 48
See application file for complete search history.

(56) References Cited

U.S. PATENT DOCUMENTS

| | | | |
|---|---|---|---|
| 2002/0017665 A1* | 2/2002 | Lyu | H01L 27/12 257/288 |
| 2002/0106825 A1* | 8/2002 | Lee | G02F 1/1345 438/30 |
| 2003/0036222 A1* | 2/2003 | Takemura | H01L 21/2022 438/149 |
| 2007/0218601 A1 | 9/2007 | Seo et al. | |

* cited by examiner

*Primary Examiner* — Chuong A Luu
(74) *Attorney, Agent, or Firm* — ScienBiziP, P.C.

(57) ABSTRACT

A manufacturing method of display array substrate is provided. The method includes depositing a first metal layer on a substrate and defining a peripheral area and a display area, coating a photo-resist layer on the first metal layer located in the peripheral area, anodizing the first metal layer to a first metal oxide layer with the photo-resist layer as a mask, patterning the first metal oxide layer located in the display area to a gate insulator, removing the photo-resist layer to expose the first metal layer in the peripheral area, forming a channel layer on the gate insulator, and depositing a second metal layer and patterning the second metal layer located in the display area to form a source electrode and a drain electrode.

17 Claims, 10 Drawing Sheets

DISPLAY ARRAY SUBSTRATE AND MANUFACTURING METHOD THEREOF

FIELD

The subject matter herein generally relates to a display array substrate, and more particularly, to a display array substrate having an anodized layer as a gate insulator and a manufacturing method thereof.

BACKGROUND

In the display industry, TFT (Thin Film Transistor) has been broadly applied as a switch element. For the category of metal oxide semiconductor, aluminum oxide ($Al_2O_3$) is usually utilized as one kind of material to form a gate insulator through anodization of aluminum on a display array substrate and further, in the peripheral area of the display array substrate, a thorough hole must be formed by etching the corresponding part of aluminum oxide ($Al_2O_3$) in order to expose an end of gate lines for electrically connecting to an outside of the display array substrate. However, it is difficult to increase the etching rate in order to improve the efficiency of manufacturing the display array substrate.

BRIEF DESCRIPTION OF THE DRAWINGS

Implementations of the present technology will now be described, by way of example only, with reference to the attached figures.

DETAILED DESCRIPTION

Figure 1:
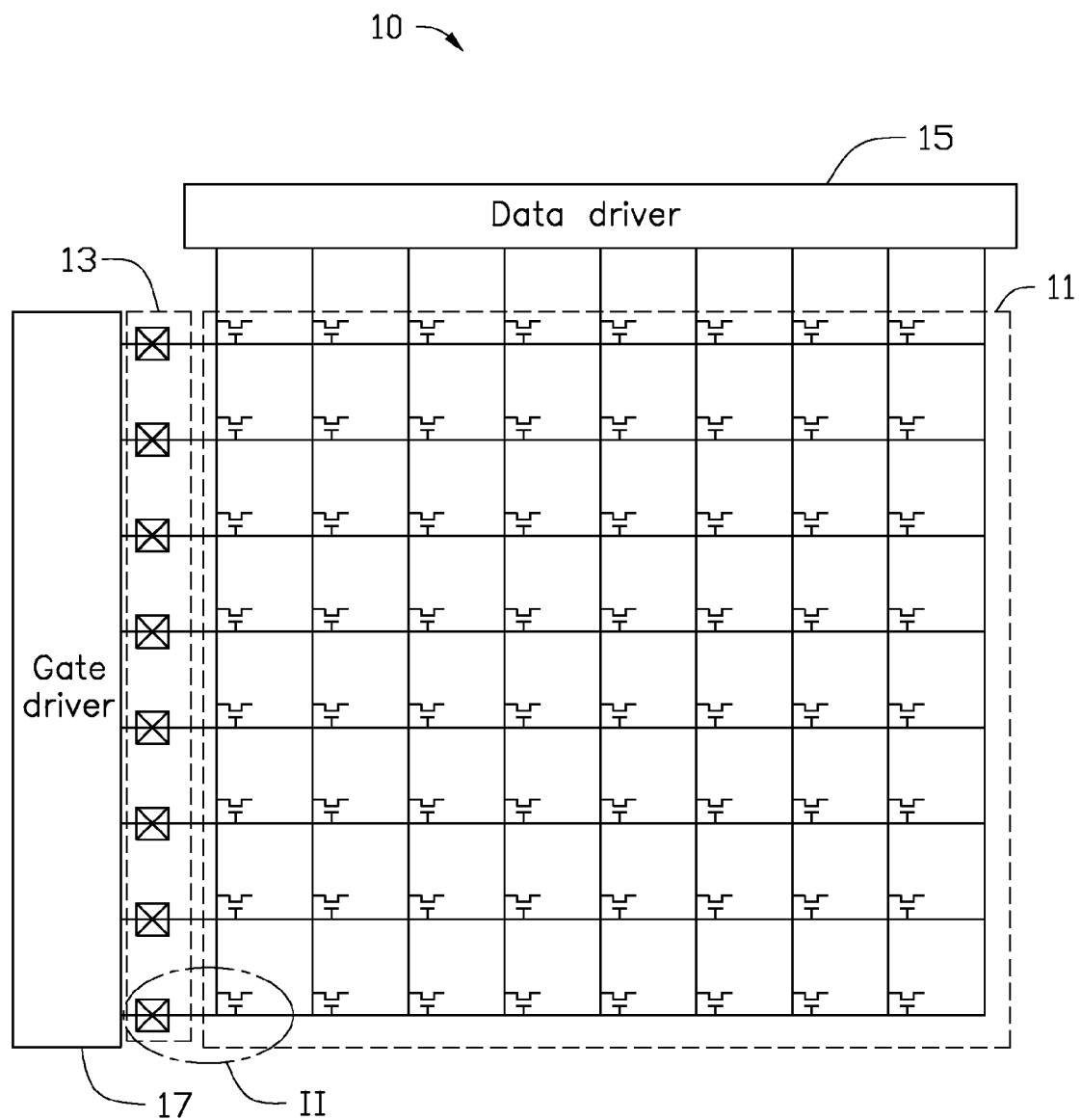
FIG. 1 is a diagrammatic view of a display array substrate of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Figure 2:
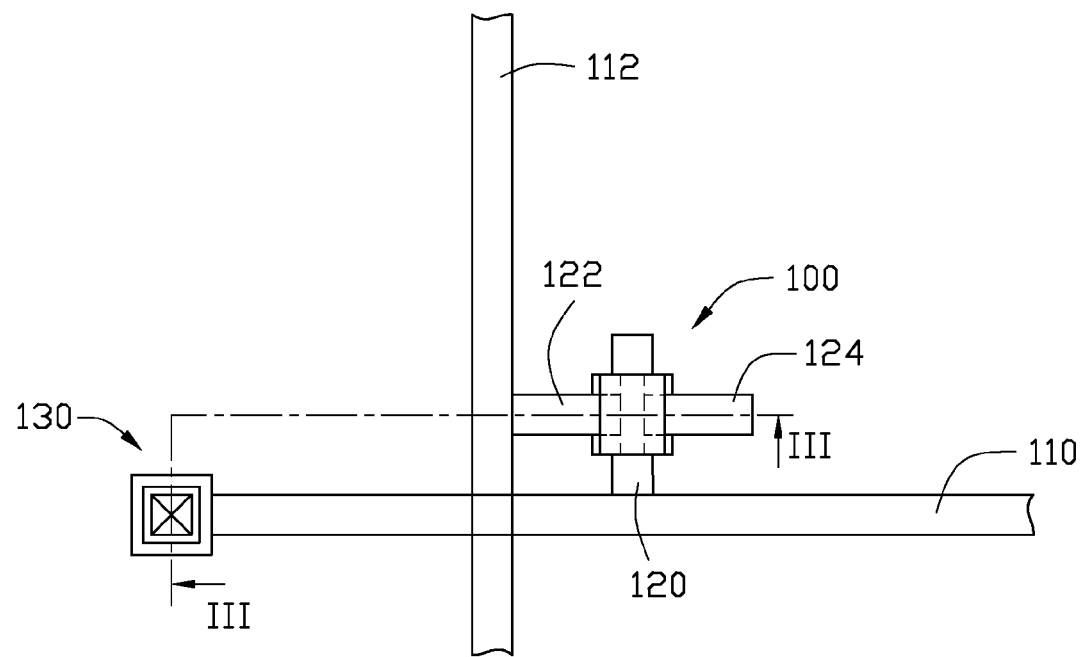
FIG. 2 is a diagrammatic view of the zone II of FIG. 1.
Figure 3:
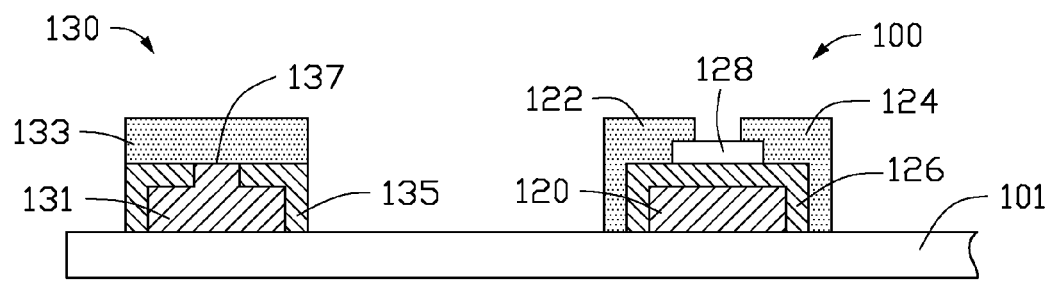
FIG. 3 is a cross-sectional view taken along line III-III of the display array substrate of FIG. 2.

Referring to FIG. 1 though FIG. 3, FIG. 1 is a diagrammatic view of a display array substrate of the present disclosure. FIG. 2 is a diagrammatic view of the zone II of FIG. 1. FIG. 3 is a cross-sectional view taken along line III-III of the display array substrate of FIG. 2. In detail, the display array substrate 10 includes a display area 11 and a peripheral area 13. In the display area 11, a plurality of gate lines 110 are disposed on the display array substrate 10 in a first direction and a plurality of data lines 112 are disposed on the display array substrate 10 in a second direction so as to intersect the gate lines 110 in the display area 11. A plurality of TFTs (thin film transistors) 100 are disposed at an intersection area defined by the gate lines 110 and the data lines 112. Moreover, a plurality of gate connecting pads 130 are disposed in an end 131 of the gate lines 110 in the peripheral area 13.

A TFT (thin film transistor) 100 further includes a gate electrode 120 connected to the gate line 110 for receiving a plurality of gate signals from a gate driver 17 through the gate connecting pads 130 and a source electrode 122 connected to the data line 112 for receiving a plurality of data signals from a data driver 15. A drain electrode 124 is spaced apart from the source electrode 122.

The TFT (thin film transistor) 100 also includes a gate insulator 126 and a channel layer 128. The gate connecting pad 130 includes the end 131 of the gate line 110 and a pad electrode 133. The end 131 of the gate line 110 is partly covered by a first insulation layer 135 and a thorough hole 137 is formed on the first insulation layer 135 so as to electrically connect the end 131 of the gate line 110 to the pad electrode 133. Furthermore, the first insulation layer 135 is formed by directly anodizing the end 131 of gate line 110 except for a region where the thorough hole 137 is formed.

The gate electrode 120 and the end 131 of gate line 110 are disposed on a substrate 101 and the source electrode 122 is disposed on the same level as the drain electrode 124. Moreover, the source electrode 122 and the drain electrode 124 are connected through the channel layer 128 positioned opposite to the gate electrode 120. The gate insulator 126 is positioned between the gate electrode 120 and the channel layer 128. When a voltage generated based on the gate signal is higher than the threshold voltage of the TFT (thin film transistor) 100, the electronic characteristic of the channel layer 128 of the TFT (thin film transistor) 100 is changed so the data signal is transmitted from the source electrode 122 to the drain electrode 124 through the channel layer 128.

Figure 10:
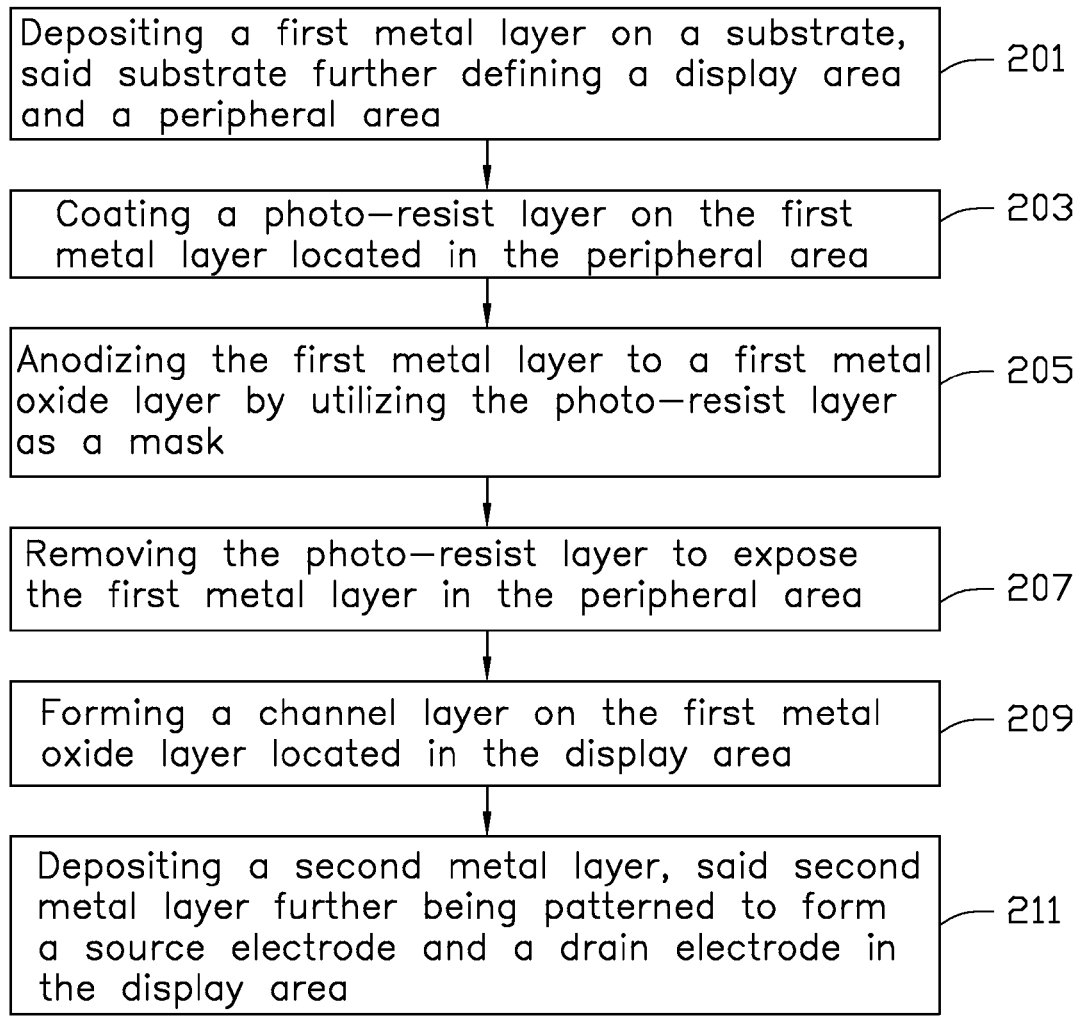
FIG. 10 is a flow chart illustrating the process of manufacturing TFT (Thin Film Transistor) of FIG. 1.

Referring to FIG. 10, a flowchart is presented in accordance with an example embodiment which is being thus illustrated. The example method is provided by way of example, as there are a variety of ways to carry out the method. The method described below can be carried out using the configurations illustrated in FIGS. 4 and 5, for example, and various elements of these figures are referenced in explaining example method. Each block shown in FIG. 10 represents one or more processes, methods or subroutines, carried out in the example method. Additionally, the illustrated order of blocks is by example only and the order of the blocks can change according to the present disclosure. The example method can begin at block 201.

Figure 4:
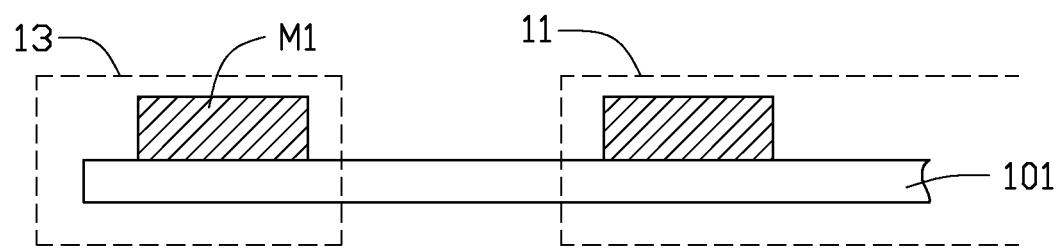
FIG. 4 is a diagrammatic view illustrating a first step of a process of manufacturing TFT (Thin Film Transistor) of FIG. 1.

At block 201, referring to FIG. 4, FIG. 4 is a diagrammatic view illustrating a first step of a process of manufacturing TFT (Thin Film Transistor) of FIG. 1, a first metal layer M1 is deposited and patterned to form at least two portions on the substrate 101 where the peripheral area 13 and the display area 11 are further defined. In the present invention, the substrate 101 is a transparent substrate like a glass substrate or a quartz substrate. The first metal layer M1 may be formed of aluminum but not limited to.

Figure 5:
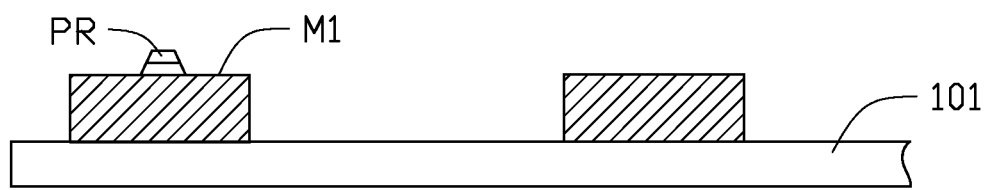
FIG. 5 is a diagrammatic view illustrating a second step of a process of manufacturing TFT (Thin Film Transistor) of FIG. 1.

At block 203, referring to FIG. 5, FIG. 5 is a diagrammatic view illustrating a second step of a process of manufacturing TFT (Thin Film Transistor) of FIG. 1, a photo-resist layer PR is coated on the first metal layer M1 located in the peripheral area 13.

Figure 6:
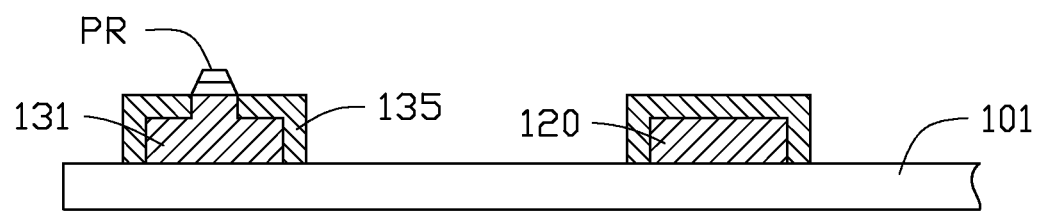
FIG. 6 is a diagrammatic view illustrating a third step of a process of manufacturing TFT (Thin Film Transistor) of FIG. 1.

At block 205, referring to FIG. 6, FIG. 6 is a diagrammatic view illustrating a third step of a process of manufacturing TFT (Thin Film Transistor) of FIG. 1, by utilizing the photo-resist layer PR, the first metal layer M1 is anodized to the first metal oxide layer 135. An un-anodized part of the first metal layer M1 in the display area 11 is defined as the gate electrode 120 and an un-anodized part of the first metal layer M1 in the peripheral area 13 is also defined as the end 131 of the gate line 110. It can be understood that the gate line 110 and the gate electrode 120 are formed in the same step. In an embodiment of the present invention, the first metal oxide layer 135 is formed of aluminum oxide.

Figure 7:
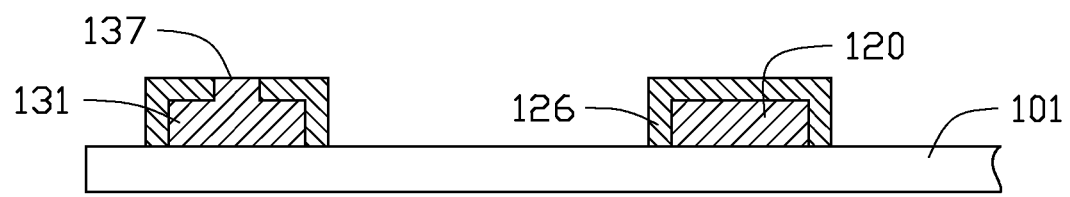
FIG. 7 is a diagrammatic view illustrating a fourth step of a process of manufacturing TFT (Thin Film Transistor) of FIG. 1.

At block 207, referring to FIG. 7, FIG. 7 is a diagrammatic view illustrating a fourth step of a process of manufacturing TFT (Thin Film Transistor) of FIG. 1, the first metal oxide layer 135 is patterned to form the gate insulator 126 in the display area 11 and by removing the photo-resist layer PR, the though hole 137 is formed so as to expose the end 131 of the gate line 110.

Figure 8:
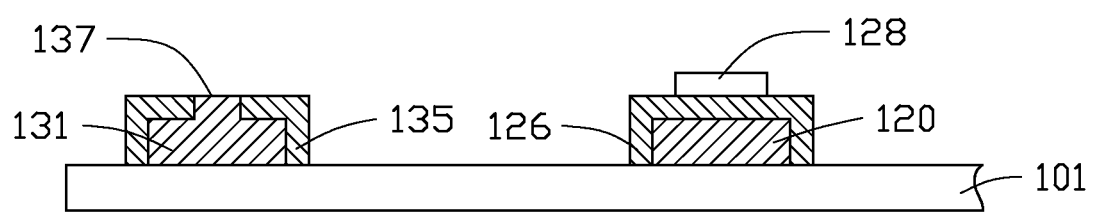
FIG. 8 is a diagrammatic view illustrating a fifth step of a process of manufacturing TFT (Thin Film Transistor) of FIG. 1.

At block 209, referring to FIG. 8, FIG. 8 is a diagrammatic view illustrating a fifth step of a process of manufacturing TFT (Thin Film Transistor) of FIG. 1, the channel layer 128 is formed on the gate insulator 126 and is made of one kind of metal oxide semiconductor like indium gallium zinc oxide (IGZO), zinc oxide (ZnO), indium oxide (InO), gallium oxide (GaO) or its mixture. In an embodiment of the present invention, by utilizing a sputter method, a vacuum deposition, a pulsed laser deposition, an ion plating method, a metal organic chemical vapor deposition, a plasma method or the like, a metal oxide semiconductor layer is deposited on the gate insulator 126 and the metal oxide semiconductor layer is further patterned to form the channel layer 128.

Figure 9:
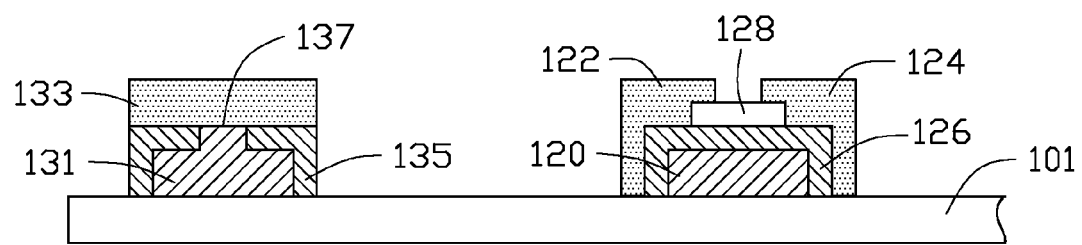
FIG. 9 is a diagrammatic view illustrating a sixth step of a process of manufacturing TFT (Thin Film Transistor) of FIG. 1.

At block 211, referring to FIG. 9, FIG. 9 is a diagrammatic view illustrating a sixth step of a process of manufacturing TFT (Tin Film Transistor) of FIG. 1, a second metal layer is deposited and further patterned to the source electrode 122 and the drain electrode 124 in the display area 11. In the peripheral area 13, the second metal layer is patterned to form the pad electrode 133. The second metal layer is made of metal or metal alloy, like molybdenum (Mo), aluminum (Al), chromium (Cr), copper (Cu), neodymium (Nd), or the mixture. By utilizing a photolithographic process, the second metal layer is patterned to form the source electrode 122 and the drain electrode 124. In an embodiment of the present invention, the photolithographic process is a wet etching process.

In the following process, a planarization layer and a pixel electrode can be formed on the TFT (thin film transistor) 100 as known in the art.

By utilizing the photo-resist layer PR as a mask, the though hole 137 is not needed to be etched on the first metal oxide layer 135 so the efficiency of manufacturing the display array substrate 10 can be improved.

The embodiments shown and described above are only examples. Many details are often found in the art such as the other features of a display. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A manufacturing method of a display array substrate, comprising:
   providing a substrate having a display area and a peripheral area;
   depositing a first metal layer on the substrate;
   coating a photo-resist layer on a portion of the first metal layer located in the peripheral area;
   anodizing the first metal layer to form a first metal oxide layer by utilizing the photo-resist layer as a mask, wherein the first metal oxide layer in the display area forms a gate insulator and the first metal oxide layer in the peripheral area forms a first insulation layer;
   removing the photo-resist layer to expose the first metal layer in the peripheral area;
   forming a channel layer on the gate insulator; and
   depositing a second metal layer in a pattern to form a source electrode and a drain electrode in the display area, and form a pad electrode in the peripheral area.

2. The manufacturing method of claim 1, wherein an un-anodized part of the first metal layer in the display area is defined as a gate electrode and an un-anodized part of the first metal layer in the peripheral area is defined as an end of a gate line.

3. The manufacturing method of claim 2, wherein the end of the gate line is exposed by removing the photo-resist layer.

4. The manufacturing method of claim 2, wherein the source electrode and the drain electrode are connected through the channel layer positioned opposite to the gate electrode; and the gate insulator is positioned between the gate electrode and the channel layer.

5. The manufacturing method of claim 4, wherein the end of the gate line is partly covered by the first insulation layer; and the end of the gate line is electrically connected to the pad electrode.

6. The manufacturing method of claim 1, wherein the first metal layer is formed of aluminum.

7. The manufacturing method of claim 1, wherein the first metal oxide layer is formed of aluminum oxide.

8. The manufacturing method of claim 1, wherein the channel layer is selected from the group consisting of indium gallium zinc oxide (IGZO), zinc oxide (ZnO), indium oxide (InO), and gallium oxide (GaO).

9. The manufacturing method of claim 1, wherein the second metal layer is selected from the group consisting of molybdenum (Mo), aluminum (Al), chromium (Cr), copper (Cu), and neodymium (Nd).

10. The manufacturing method of claim 1, wherein the source electrode and the drain electrode are formed by a photolithographic process.

11. The manufacturing method of claim 10, wherein the photolithographic process is a wet etching process.

12. The manufacturing method of claim 1, wherein source electrode and a drain electrode are in directly contact with the gate insulator; and the pad electrode is in directly contact with the first insulation layer.

13. A manufacturing method for forming a display, comprising:
   providing a substrate having a display area and a peripheral area;
   depositing a first metal layer on the substrate having sections in the display area and the peripheral area;
   coating a photo-resist layer on a first portion of the first metal layer located in the peripheral area;
   anodizing the first metal layer to form a first metal oxide layer except at the first portion of the first metal layer coated by the photoresist layer, wherein said photoresist layer acts as a mask during the anodizing, the first metal oxide layer in the display area forms a gate insulator and the first metal oxide layer in the peripheral area forms a first insulation layer;
   removing the photo-resist layer to expose the first portion of first metal layer in the peripheral area;
   forming a channel layer on the gate insulator; and
   depositing a second metal layer over the gate insulator in a pattern to form a source electrode and a drain electrode on the channel layer and the gate insulator, and depositing a second metal layer over the first insulation layer to form a pad electrode.

14. The manufacturing method of claim 13, wherein an un-anodized part of the first metal layer in the display area is defined as a gate electrode and an un-anodized part of the first metal layer in the peripheral area is defined as an end of a gate line.

15. The manufacturing method of claim 14, wherein source electrode and a drain electrode are in directly contact with the gate insulator; and the pad electrode is in directly contact with the first insulation layer.

16. The manufacturing method of claim 15, wherein the source electrode and the drain electrode are connected through the channel layer positioned opposite to the gate electrode; and the gate insulator is positioned between the gate electrode and the channel layer.

17. The manufacturing method of claim 16, wherein the end of the gate line is partly covered by the first insulation layer; and the end of the gate line is electrically connected to the pad electrode.

* * * * *